(12) United States Patent
Huang et al.

(10) Patent No.: US 11,948,796 B2
(45) Date of Patent: Apr. 2, 2024

(54) SELECTIVE METHODS FOR FABRICATING DEVICES AND STRUCTURES

(71) Applicant: Applied Materials, Inc., Santa Clara, CA (US)

(72) Inventors: Yi-Chiau Huang, Fremont, CA (US); Chen-Ying Wu, Santa Clara, CA (US); Abhishek Dube, Fremont, CA (US); Chia Cheng Chin, Fremont, CA (US); Saurabh Chopra, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 243 days.

(21) Appl. No.: 17/616,131

(22) PCT Filed: Jun. 10, 2020

(86) PCT No.: PCT/US2020/037052
§ 371 (c)(1),
(2) Date: Dec. 2, 2021

(87) PCT Pub. No.: WO2020/252065
PCT Pub. Date: Dec. 17, 2020

(65) Prior Publication Data
US 2022/0310390 A1    Sep. 29, 2022

Related U.S. Application Data

(60) Provisional application No. 62/860,654, filed on Jun. 12, 2019.

(51) Int. Cl.
*C30B 25/10* (2006.01)
*C23C 16/06* (2006.01)
(Continued)

(52) U.S. Cl.
CPC ........ *H01L 21/02636* (2013.01); *C23C 16/06* (2013.01); *C30B 25/18* (2013.01);
(Continued)

(58) Field of Classification Search
CPC .......... C30B 25/10; C30B 29/06; C30B 29/32
See application file for complete search history.

(56) References Cited

U.S. PATENT DOCUMENTS 9,634,142 B1 * 4/2017 Schepis ............. H01L 29/66545
9,899,363 B1 * 2/2018 Bahr ................. H01L 23/53214
(Continued)

FOREIGN PATENT DOCUMENTS

KR    10-2011-0098594 A    9/2011
KR       20170061724 A    6/2017

OTHER PUBLICATIONS

Korean Office Action dated Jan. 7, 2023 for Application No. 10-2022-7000872.
(Continued)

*Primary Examiner* — Robert M Kunemund
(74) *Attorney, Agent, or Firm* — Patterson & Sheridan LLP.

(57) ABSTRACT

One or more embodiments described herein relate to selective methods for fabricating devices and structures. In these embodiments, the devices are exposed inside the process volume of a process chamber. Precursor gases are flowed in the process volume at certain flow ratios and at certain process conditions. The process conditions described herein result in selective epitaxial layer growth on the {100} planes of the crystal planes of the devices, which corresponds to the top of each of the fins. Additionally, the process conditions result in selective etching of the {110} plane of the crystal planes, which corresponds to the sidewalls of each of the fins. As such, the methods described herein provide a way to (Continued)

grow or etch epitaxial films at different crystal planes. Furthermore, the methods described herein allow for simultaneous epitaxial film growth and etch to occur on the different crystal planes.

20 Claims, 8 Drawing Sheets

(51) Int. Cl.
    *C30B 25/18*     (2006.01)
    *C30B 29/52*     (2006.01)
    *H01L 21/02*     (2006.01)
    *H01L 21/8234*     (2006.01)
    *H01L 29/08*     (2006.01)
    *H01L 29/78*     (2006.01)

(52) U.S. Cl.
    CPC ........ *C30B 29/52* (2013.01); *H01L 21/02532* (2013.01); *H01L 21/0262* (2013.01); *H01L 21/823418* (2013.01); *H01L 29/0847* (2013.01); *H01L 21/02381* (2013.01); *H01L 21/02576* (2013.01); *H01L 21/02579* (2013.01); *H01L 21/823431* (2013.01); *H01L 29/785* (2013.01)

(56) References Cited

U.S. PATENT DOCUMENTS

| | | |
|---|---|---|
| 2011/0117732 A1 | 5/2011 | Bauer et al. |
| 2014/0027783 A1* | 1/2014 | Yin .................... H01L 29/7853 257/77 |
| 2014/0027863 A1 | 1/2014 | Adam et al. |
| 2014/0120678 A1 | 5/2014 | Shinriki et al. |
| 2017/0018427 A1* | 1/2017 | Huang ............. H01L 21/02576 |
| 2017/0084688 A1* | 3/2017 | Li ......................... H01L 29/785 |
| 2017/0178962 A1 | 6/2017 | Dube et al. |

OTHER PUBLICATIONS

International Search Report dated Sep. 23, 2020 for Application No. PCT/US2020/037052.

* cited by examiner

SELECTIVE METHODS FOR FABRICATING DEVICES AND STRUCTURES

BACKGROUND

Field

One or more embodiments described herein generally relate to semiconductor fabrication, and more particularly, to selective methods for fabricating semiconductor devices and structures.

Description of the Related Art

As circuit densities increase for next generation devices, the widths of interconnects, such as vias, trenches, contacts, gate structures, and other features, as well as the dielectric materials therebetween, decrease. However, the thickness of the dielectric layers remains substantially constant, resulting in increasing the aspect ratios of the features. Recently, complementary metal oxide semiconductor (CMOS) such as FinFET devices have been introduced into various different types of semiconductor devices.

FinFET devices typically include semiconductor fins with high aspect ratios in which the channel and the source/drain regions for the transistor are formed thereover. A gate electrode is then formed over and along the side portions of the fin devices utilizing the advantage of the increased surface area of the channel and source/drain regions to produce faster, more reliable, and better-controlled semiconductor transistor devices. Further advantages of FinFETs include reducing the short channel effect and providing higher current flow.

With the continuous scaling and architecture advancement, it has been a challenge to land the source/drain contact plug directly onto the narrow fins in the FinFET devices and recessed structures with narrow vertical sidewalls. Epitaxial layers have been used to increase the volume for better contact. The typical silicon (Si) epitaxial film is faceted by {111} planes and has a diamond shape when it is observed along the transistor channel direction. The epitaxial film with dominant {111} facets may be disadvantageous because the lateral growth on the sidewalls prohibits further distance reduction of neighboring fins or sidewalls. Often times, when the device has multi-fin FinFETs or multiple vertical sidewalls, the diamond shapes of each of the epitaxial layers merge. The merged epitaxial layers can form voids, causing device defects.

Accordingly, there is a need for methods to selectively grow the epitaxial films such that lateral growth on the sidewalls is reduced.

SUMMARY

One or more embodiments described herein relate to selective methods for fabricating semiconductor device and structures.

In one embodiment, a method of processing a substrate in a process chamber includes exposing the substrate having one or more fins into a process volume of the process chamber; introducing precursor gases into the process chamber; growing an epitaxial layer on top surfaces of each of the one or more fins; and etching sidewall surfaces of each of the one or more fins; wherein growing the epitaxial layer and etching the sidewall surfaces occur simultaneously.

In another embodiment, a method of processing a substrate in a process chamber includes exposing the substrate having a recessed structure with vertical sidewalls into a process volume of the process chamber; introducing precursor gases into the process chamber; growing an epitaxial layer on a horizontal portion of the substrate between each of the vertical sidewalls; and etching surfaces of each of the vertical sidewalls, wherein growing the epitaxial layer and etching the surfaces of the vertical sidewalls occur simultaneously.

In another embodiment, a method of processing a substrate in a process chamber includes exposing the substrate having one or more fins into a process volume of the process chamber, wherein each of the one or more fins has a {100} plane and a {110} plane; introducing precursor gases into the process chamber; growing an epitaxial layer on the {100} plane of each of the one or more fins; and etching the {110} plane of each of the one or more fins; wherein growing the epitaxial layer and etching the sidewall surfaces occur simultaneously.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

In the following description, numerous specific details are set forth to provide a more thorough understanding of the embodiments of the present disclosure. However, it will be apparent to one of skill in the art that one or more of the embodiments of the present disclosure may be practiced without one or more of these specific details. In other instances, well-known features have not been described in order to avoid obscuring one or more of the embodiments of the present disclosure.

One or more embodiments described herein relate to selective methods for fabricating semiconductor devices and structures. In these embodiments, devices and structures are exposed inside the process volume of a process chamber. Precursor gases are then introduced inside the process volume of the process chamber. The reactions of the precursor gases cause epitaxial film growth on different crystal planes. As discussed above, in conventional embodiments, the epitaxial films grow laterally on each of the fins in multi-fin FinFET devices or on the vertical sidewalls in recessed structures, reducing the width between each of the fins or vertical sidewalls. The lateral growth sometimes causes the epitaxial layers to merge together. Merging of the epitaxial layers can form voids, leading to device defects and reduced performance.

In embodiments described herein, precursor gases are flowed in the process volume of the process chamber at certain flow ratios and at certain process conditions. The process conditions described herein result in selective epitaxial layer growth on the {100} planes of the crystal planes of the FinFET devices or recessed structures, which corresponds to the top of each of the fins of the multi-fin FinFET devices or vertical sidewalls of the recessed structures. Additionally, the process conditions result in selective etching of the {110} plane of the crystal planes, which corresponds to the sidewalls of each of the devices. As such, the methods described herein provide a way to grow or etch epitaxial films at different crystal planes. The film of interest can grow on certain crystal planes but etch on certain other planes. Additionally, the methods described herein allow simultaneous epitaxial film growth and etch to occur on the different crystal planes, achieving certain crystal forms of shapes. Simultaneous growth and etch provide faster throughput and better process control compared to the sequential growth and etch processes required in conventional embodiments.

Figure 1:
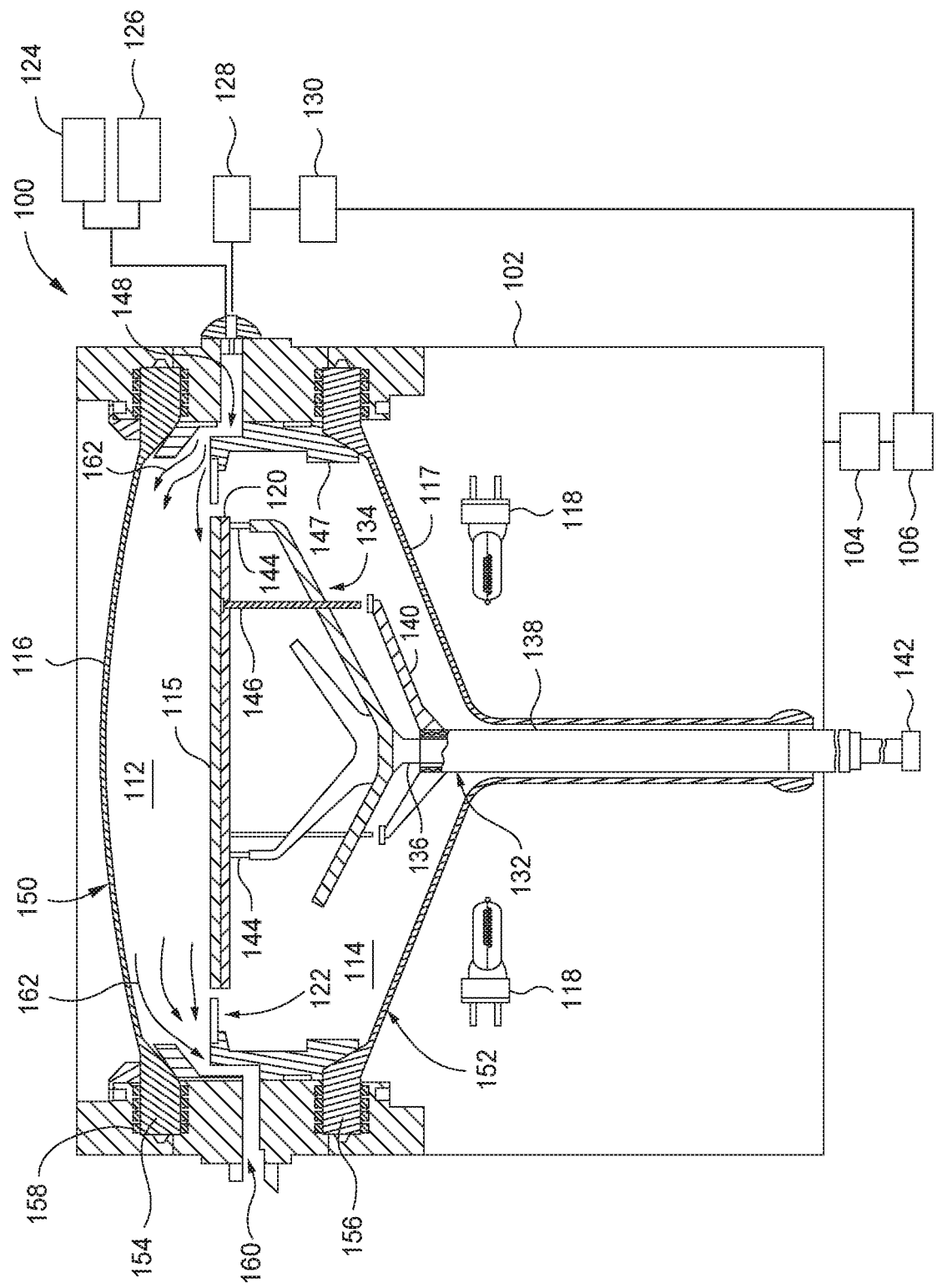
FIG. 1 is a schematic view of a process system according to at least one embodiment described herein.

FIG. 1 is a cross-sectional view of a process system 100 that may be used to perform the methods described herein. The process system 100 includes a process chamber body 102, support systems 104, and a controller 106. The process chamber body 102 includes an upper portion 112 and a lower portion 114. The upper portion 112 includes the area within the process chamber body 102 between the upper dome 116 and a substrate 115. The lower portion 114 includes the area within the process chamber body 102 between a lower dome 117 and the bottom of the substrate 115. Deposition processes generally occur on the upper surface of the substrate 115 within the upper portion 112.

The support system 104 includes components used to execute and monitor pre-determined processes, such as the growth of epitaxial films in the process chamber body 102. A controller 106 is coupled to the support system 104 and is adapted to control the process system 100 and support system 104. The controller 106 includes a central processing unit (CPU), a memory, and support circuits.

The process system 100 includes a plurality of heat sources, such as lamps 118, which are adapted to provide thermal energy to components positioned within the process chamber body 102. For example, the lamps 118 may be adapted to provide thermal energy to the substrate 115, a susceptor 120, and/or the preheat ring 122. The lower dome 117 may be formed from an optically transparent material, such as quartz, to facilitate the passage of thermal radiation therethrough. It is contemplated that lamps 118 may be positioned to provide thermal energy through the upper dome 116 as well as the lower dome 117.

The process chamber body 102 also includes a plurality of plenums formed therein. The plenums are in fluid communication with one or more gas sources 124, such as a carrier gas, and one or more precursor sources 126, such as deposition gases and dopant gases. For example, a first plenum 148 may be adapted to provide a deposition gas 162 therethrough into the upper portion 112 of the process chamber body 102, while a second plenum 160 may be adapted to exhaust the deposition gas 162 from the upper portion 112. In such a manner, the deposition gas 162 may flow parallel to an upper surface of the substrate 115.

In cases where a liquid precursor (e.g., tetrasilane) is used, the process system 100 may include a liquid vaporizer 130 in fluid communication with a liquid precursor source 128. The liquid vaporizer 130 is be used for vaporizing liquid precursors to be delivered to the process system 100. While not shown, it is contemplated that the liquid precursor source 128 may include, for example, one or more ampules of precursor liquid and solvent liquid, a shut-off valve, and a liquid flow meter (LFM).

A substrate support assembly 132 is positioned in the lower portion 114 of the process chamber body 102. The substrate support assembly 132 is illustrated supporting a substrate 115 in a processing position. The substrate support assembly 132 includes a susceptor support shaft 134 formed from an optically transparent material and the susceptor 120 supported by the susceptor support shaft 134. A shaft 136 of the susceptor support shaft 134 is positioned within a shroud 138 to which lift pin contacts 140 are coupled. The susceptor support shaft 134 is rotatable in order to facilitate the rotation of the substrate 115 during processing. Rotation of the susceptor support shaft 134 is facilitated by an actuator 142 coupled to the susceptor support shaft 134. The shroud 138 is generally fixed in position, and therefore, does not rotate during processing. Support pins 144 couple the susceptor support shaft 134 to the susceptor 120.

Lift pins 146 are disposed through openings (not labeled) formed in the susceptor support shaft 134. The lift pins 146 are vertically actuatable and are adapted to contact the underside of the substrate 115 to lift the substrate 115 from a processing position (as shown) to a substrate removal position.

The preheat ring 122 is removably disposed on a lower liner 147 that is coupled to the process chamber body 102. The preheat ring 122 is disposed around the internal volume of the process chamber body 102 and circumscribes the substrate 115 while the substrate 115 is in a processing position. The preheat ring 122 facilitates preheating of a process gas as the process gas enters the process chamber body 102 through the first plenum 148 adjacent to the preheat ring 122.

The central window portion 150 of the upper dome 116 and the bottom portion 152 of the lower dome 117 may be formed from an optically transparent material such as quartz. The peripheral flange 154 of the upper dome 116, which engages the central window portion 150 around a circumference of the central window portion 150, the peripheral flange 156 of the lower dome 117, which engages the bottom portion around a circumference of the bottom portion, may all be formed from an opaque quartz to protect the O-rings 158 proximity to the peripheral flanges from being directly exposed to the heat radiation. The peripheral flange 154 may be formed of an optically transparent material such as quartz.

Figure 2A:
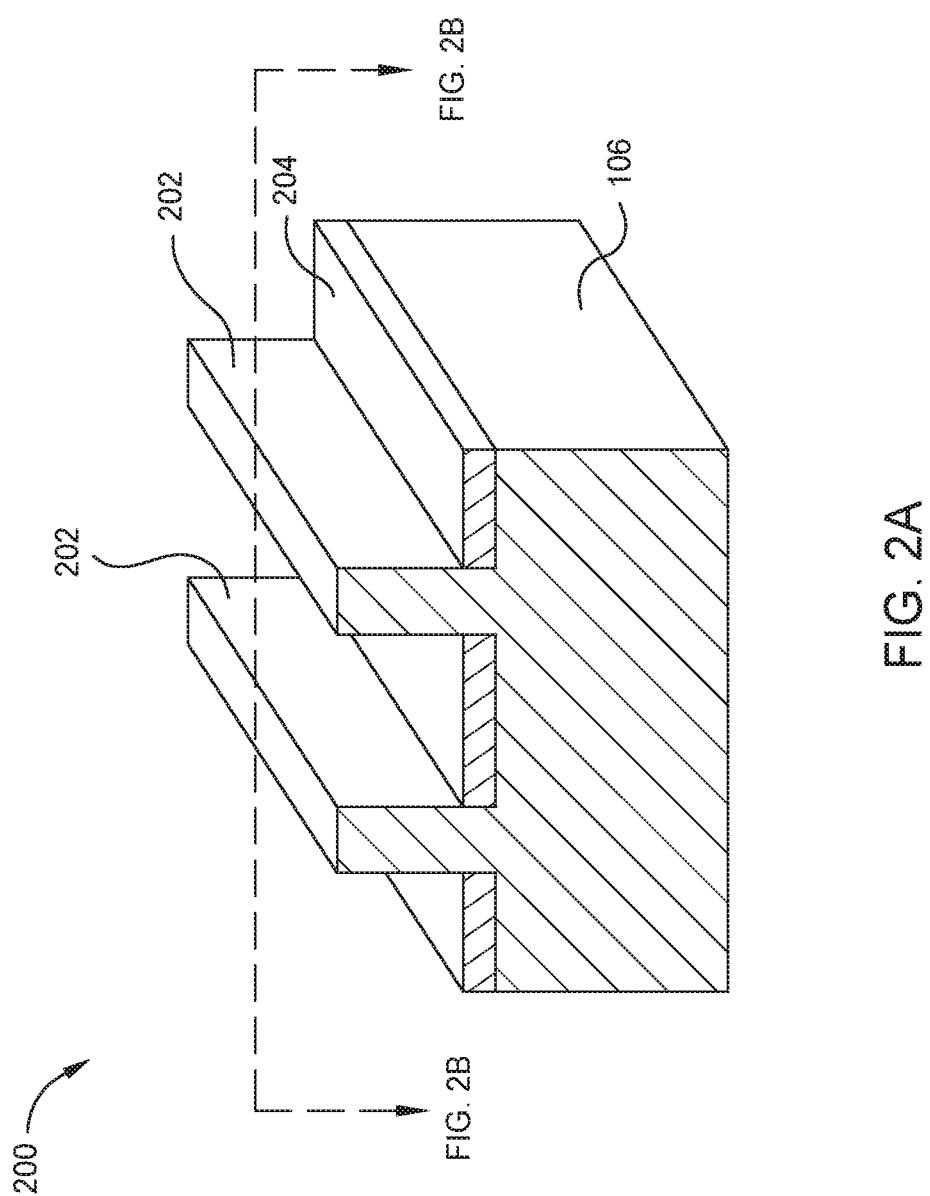
FIG. 2A is a schematic sectional view of a FinFET device according to at least one embodiment described herein.
Figure 2B:
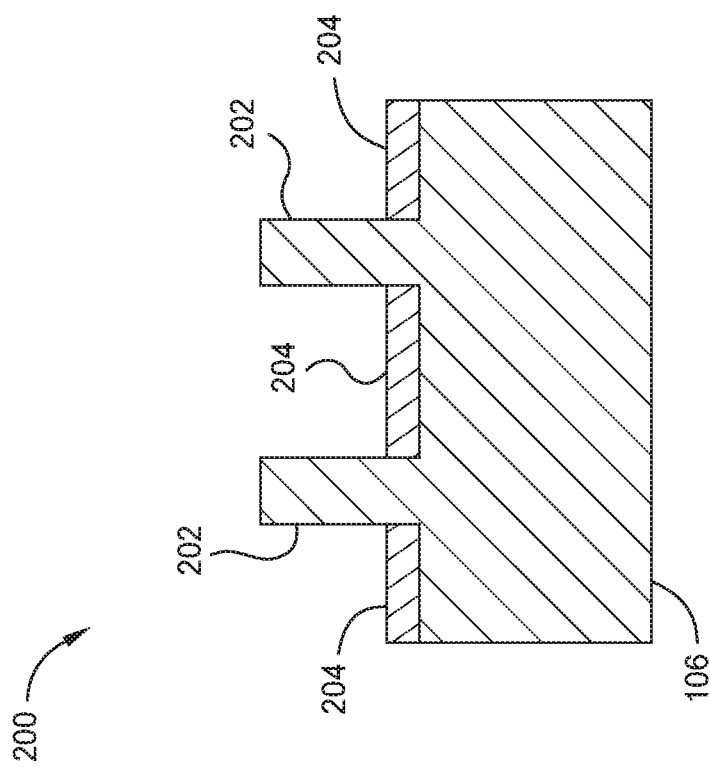
FIG. 2B is a sectional view of the FinFET device cut at the line 2B-2B as shown in FIG. 2A.

FIG. 2A is a schematic sectional view and FIG. 2B is a sectional view of a FinFET device 200 cut at the line 2B-2B as shown in FIG. 2A according to at least one embodiment described herein. In these embodiments, the substrate 115 includes vertical fins 202 and a dielectric layer 204. The substrate 115 may be a bulk Si substrate, silicon-on-insulator (SOI) substrate, germanium (Ge) substrate, or the like. The vertical fins 202 extend vertically from an upper surface of the substrate 115. The vertical fins 202 may be formed by masking and etching an upper surface of the substrate 115, resulting in the vertical fins 202. However, in other embodiments, other formation methods are also contemplated. The dielectric layer 204 facilitates electrical isolation between devices formed on the substrate 115. As illustrated in FIGS. 2A-2B, the vertical fins 202 extend a distance above the upper surface of the dielectric layer 204. In some embodiments, the dielectric layer 204 is formed from one or more of silicon dioxide ($SiO_2$), silicon nitride ($Si_3N_4$), or silicon oxynitride ($SiO_xN_y$). However, in other embodiments, other dielectric materials are contemplated.

Figure 3:
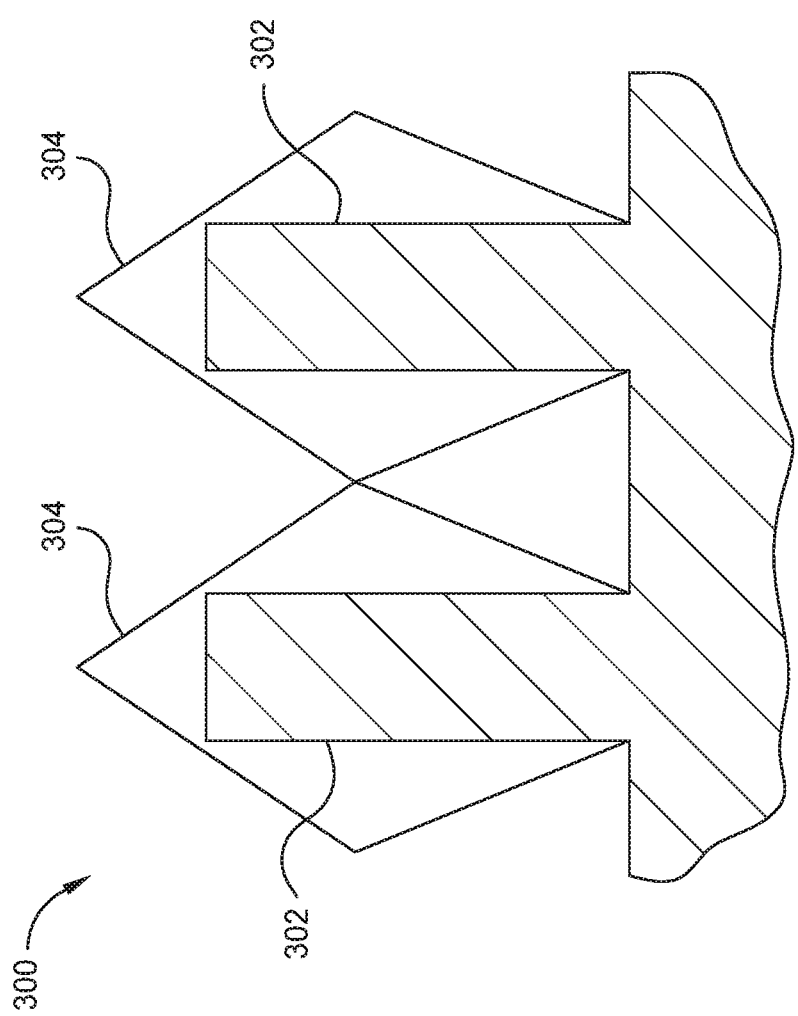
FIG. 3 is a sectional view of a FinFET device according to the prior art.

FIG. 3 is a sectional view of a prior art FinFET device 300. In conventional embodiments, as discussed above and shown in FIG. 3, epitaxial layers 304 grow laterally on each fin 302 in the FinFET device 300, reducing the width between each of the fins 302. The lateral growth sometimes causes the epitaxial layers 304 to merge together. Merging of the epitaxial layer 304 can form voids, leading to device defects and reduced performance. As such, the configuration shown in FIG. 3 is often problematic and needs improvement, which is provided in the embodiments described below.

Figure 4:
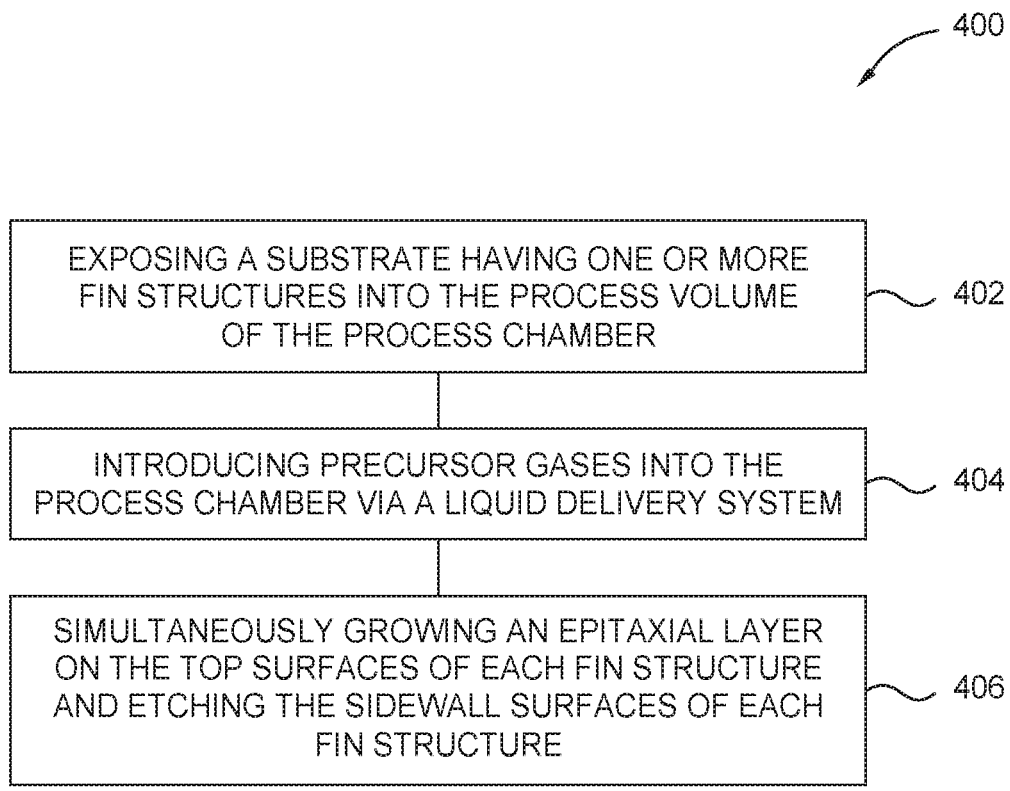
FIG. 4 is a flow chart of a method according to at least one embodiment described herein.
Figure 5B:
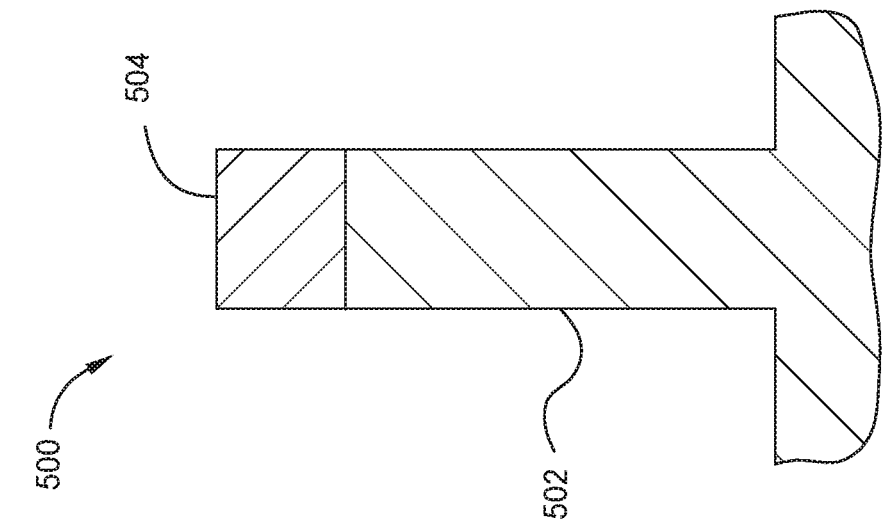
FIGS. 5A-5B show a FinFET device at some blocks of the method described in FIG. 4.
Figure 5A:
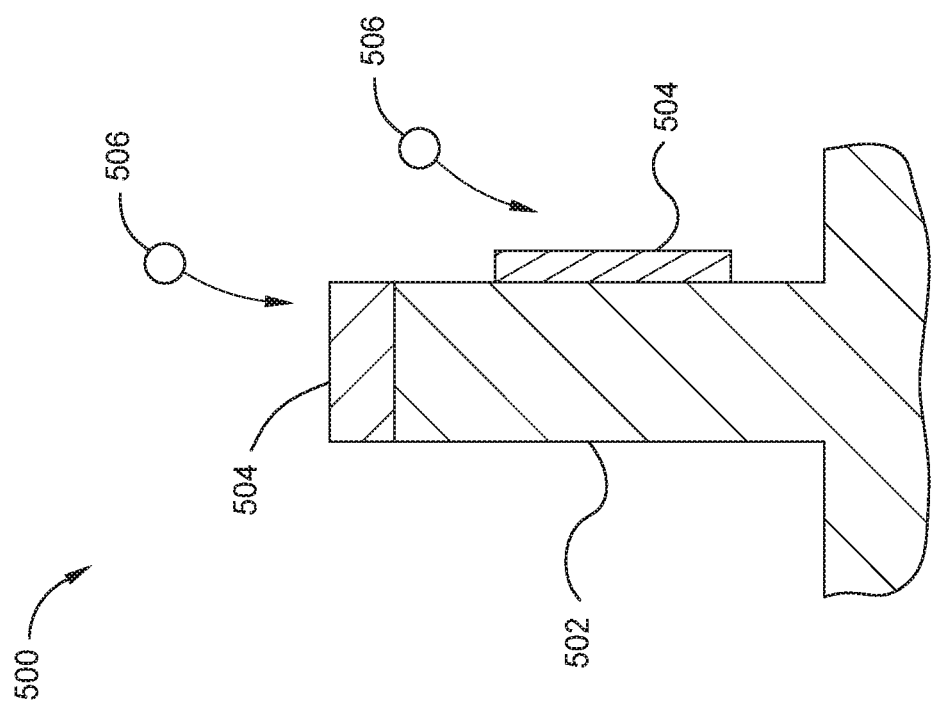

FIG. 4 is a flow chart of a method 400 according to at least one embodiment described herein. In these embodiments, the method 400 is performed with the systems and devices described in FIGS. 1-2B, but is not limited to these systems and devices and can be performed with other similar systems and devices. FIGS. 5A-5B show a FinFET device 500 at some blocks of the method 400 described in FIG. 4.

In block 402, a FinFET device 500 having one or more fins 502 is exposed the process chamber body 102. In some embodiments, the process chamber 102 is at temperatures at or below about 700 degrees Celsius (C), such as between about 350 degrees C. and about 700 degrees C. Additionally, in some embodiments, the process chamber is at pressures at or below 10 Torr, such as between about 5 Torr and about 10 Torr.

In block 404, precursors are introduced into the process chamber body 102. The precursors enter the process chamber body 102 as discussed above and as shown in FIG. 1. In these embodiments, a carrier gas is used to transport the vapor into the process chamber 102. In one embodiment the carrier gas is hydrogen ($H_2$). However, in other embodiments, nitrogen ($N_2$) can be used as the carrier gas. The carrier gas flow rate can be between about 100 and about 1000 sccm. In some embodiments, the precursors are silicon (Si) containing precursors and may include silane ($SiH_4$). However, in other embodiments, higher order silanes with the empirical formula $Si_xH_{(2x+2)}$, such as disilane ($Si_2H_6$), trisilane ($Si_3H_6$), and tetrasilane ($Si_4H_{10}$), or other higher order silanes such as polychlorosilane may be used. Additionally, in some embodiments, the precursors are germanium (Ge) containing precursors and may include chlorinated gases or liquids such as germanium tetrachloride ($GeCl_4$). However, in other embodiments, other chlorinated germane gases or liquids such as dichlorogermane ($GeH_2Cl_2$), trichlorogermane ($GeHCl_3$), hexachloro-digermane ($Ge_2Cl_6$), or a combination of any two or more thereof can be used. In addition to the precursors, in these embodiments, diborane ($B_2H_6$) is used as a dopant. However, in other embodiments, other dopants can be used such as phosphine ($PH_3$) or arsine ($AsH_3$).

In block 406, an epitaxial layer 504 is grown on the top surface and sidewall surfaces of the fin 502, as shown in FIG. 5A. The top surface of the fin 502 corresponds to the {100} plane of the crystal plane of the FinFET device 500. The sidewall surfaces of the fin 502 corresponds to the {110} plane of the crystal plane of the FinFET device 500. The chemistries of precursor molecules 506 act to form the epitaxial layer 504 that grows on the top surface and sidewall surfaces of the fin 502. For example, in these embodiments, silane ($SiH_4$) and germanium tetrachloride ($GeCl_4$) can be the precursor molecules 506 used to grow the epitaxial layer 504 on the surfaces of the fin 502. Although growth is occurring, the chlorine (Cl) atoms within $GeCl_4$ act to simultaneously etch the epitaxial layer 504. On the sidewalls of the fin 502, etch occurs at a greater rate than growth, preventing the accumulation of the growth on the sidewalls. Therefore, lateral growth of the epitaxial layer 504 that can occur in conventional embodiments, as described above in FIG. 3, is prevented. As such, the merging of the epitaxial layers 504 is prevented in multi-fin structures, preventing device defects and improving device performance. However, when using the $SiH_4$ and $GeCl_4$ precursor molecules 506, growth on the top surface occurs at a greater rate than etch, which allows for the accumulation of growth of the epitaxial layer 504 on the top surface of the fin 502. In some embodiments, the growth rate of the epitaxial layer 504 on the top surface of the fin 502 can be between about 30 Å/min and about 300 Å/min. Therefore, the method 400 allows for simultaneous epitaxial film growth and etch to occur on the different crystal planes, achieving certain crystal forms and shapes. Simultaneous growth and etch provide faster throughput and better process control compared to the sequential growth and etch processes required in conventional embodiments.

Following the method 400, the resulting FinFET device 500 is shown in FIG. 5B. The resulting FinFET device 500 includes an epitaxial layer 504 formed on the top surface of the fin 502. However, the resulting FinFET device 500 has no epitaxial layer 504 formed on its sidewalls. Accordingly, the method 400 advantageously results in selective epitaxial growth on FinFET devices, such as the FinFET device 500. In these embodiments, the resulting epitaxial layer 504 can be between about 10 nm and about 30 nm, such as about 20 nm.

Figure 6:
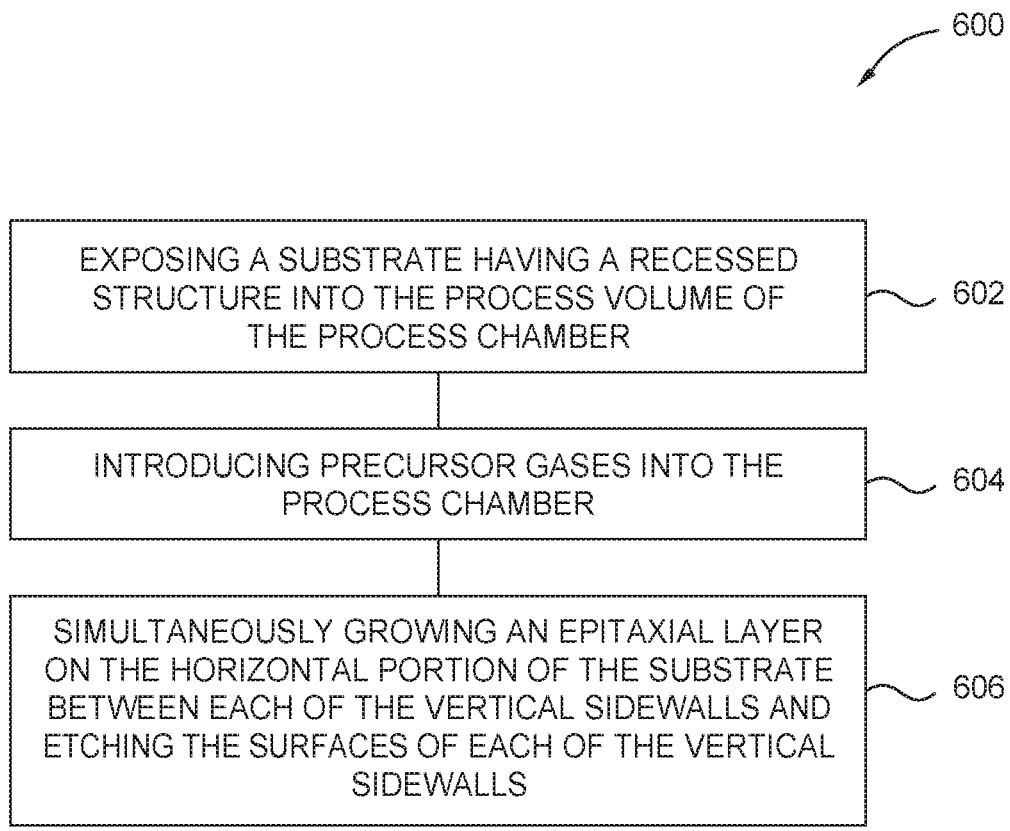
FIG. 6 is a flow chart of a method according to at least one embodiment described herein.
Figure 7A:
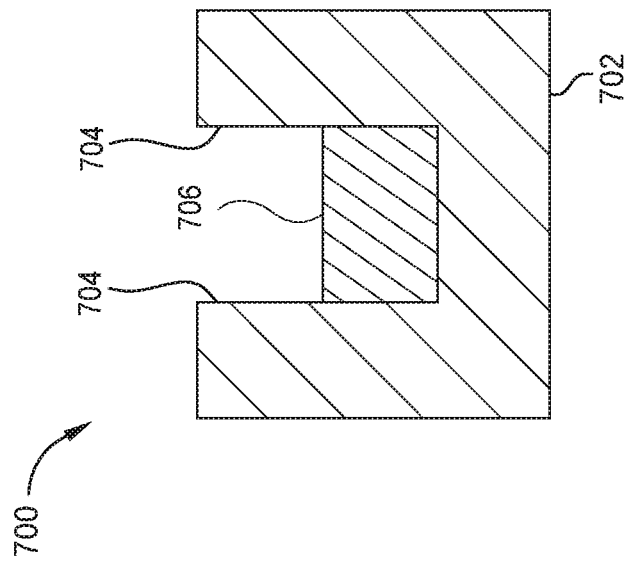
FIGS. 7A-7B show a recessed structure at some blocks of the method described in FIG. 6.
Figure 7B:
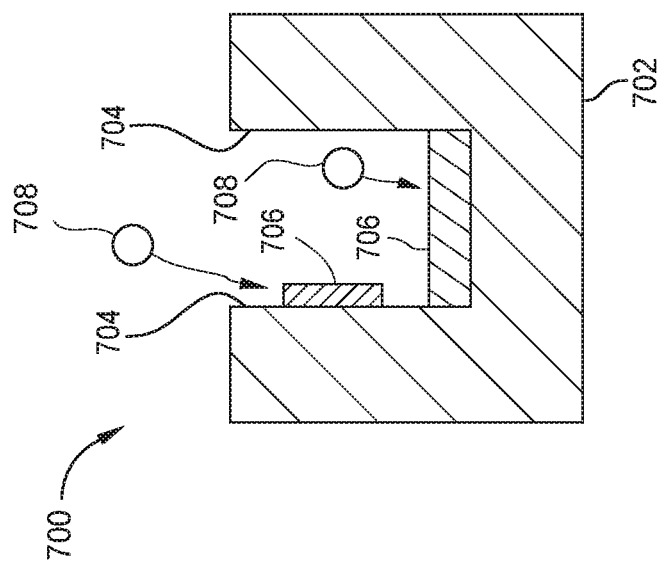

FIG. 6 is a flow chart of a method 600 according to at least one embodiment described herein. In these embodiments, the method 600 is performed with the systems and devices described in FIGS. 1-2B, but is not limited to these systems and devices and can be performed with other similar systems and devices. FIGS. 7A-7B show a recessed structure 700 at some blocks of the method 600 described in FIG. 6.

In block 602, the recessed structure 700 having a substrate 702 is exposed into the process chamber body 102. The substrate 702 includes vertical sidewalls 704. In some embodiments, the process chamber 102 is at temperatures at or below about 700 degrees Celsius (C), such as between about 350 degrees C. and about 700 degrees C. Additionally, in some embodiments, the process chamber is at pressures at or below 10 Torr, such as between about 5 Torr and about 10 Torr.

In block 604, precursors are introduced into the process chamber body 102. The precursors enter the process chamber body 102 as discussed above and as shown in FIG. 1. In these embodiments, a carrier gas is used to transport the vapor into the process chamber 102. In one embodiment, the carrier gas is hydrogen ($H_2$). However, in other embodiments, nitrogen ($N_2$) can be used as the carrier gas. The carrier gas flow rate can be between about 100 and about 1000 sccm. In some embodiments, the precursors are Si containing precursors and may include silane ($SiH_4$). However, in other embodiments, higher order silanes with the empirical formula $SixH_{(2x+2)}$, such as disilane ($Si_2H_6$), trisilane ($Si_3H_6$), and tetrasilane ($Si_4H_{10}$), or other higher order silanes such as polychlorosilane may be used. Additionally, in some embodiments, the precursors are Ge containing precursors and may include chlorinated gases or liquids such as germanium tetrachloride ($GeCl_4$). However, in other embodiments, other chlorinated germane gases or liquids such as dichlorogermane ($GeH_2Cl_2$), trichlorogermane ($GeHCl_3$), hexachloro-digermane ($Ge_2Cl_6$), or a combination of any two or more thereof may be used. In addition to the precursors, in these embodiments, diborane ($B_2H_6$) is used as a dopant. However, in other embodiments, other dopants can be used such as phosphine ($PH_3$) or arsine ($AsH_3$).

In block 606, an epitaxial layer 706 is grown directly on the substrate 702 between each of the vertical sidewalls 704 and directly on the vertical sidewalls 704, as shown in FIG. 7A. The horizontal surface between each of the vertical sidewalls 704 corresponds to the {100} plane of the crystal plane of the recessed structure 700. The vertical sidewalls 704 corresponds to the {110} plane of the crystal plane of the recessed structure 700. The chemistries of precursor molecules 708 act to form the epitaxial layer 706 that grows on the horizontal portion of the substrate 702 between each of the vertical sidewalls 704 and directly on the vertical sidewalls 704. For example, in these embodiments, silane ($SiH_4$) and germanium tetrachloride ($GeCl_4$) can be the precursor molecules 708 used to grow the epitaxial layer 706 on the surfaces of the substrate 702. Although growth is occurring, the chlorine (Cl) atoms act to simultaneously etch the epitaxial layer 706. On the vertical sidewalls 704, etch occurs at a greater rate than growth, preventing the accumulation of growth of the epitaxial layer 706 on the vertical sidewalls 704. Therefore, lateral growth of the epitaxial layer 706 that can occur in conventional embodiments, such as described above in FIG. 3, is prevented. As such, the merging of the epitaxial layers 706 is prevented in recessed structures, preventing device defects and improving device performance. However, when using the $SiH_4$ and $GeCl_4$ precursor molecules 708, growth at horizontal surface between the vertical sidewalls 704 occurs at a greater rate than etch, which allows for the accumulation of growth of the epitaxial layer 706 on the horizontal surface between each of vertical sidewalls 704. In some embodiments, the growth rate of the epitaxial layer 706 between each of the vertical sidewalls 702 can be between about 30 Å/min and about 300 Å/min. Therefore, the method 600 allows for simultaneous epitaxial film growth and etch to occur on the different crystal planes, achieving certain crystal forms and shapes. Simultaneous growth and etch provide faster throughput and better process control compared to the sequential growth and etch processes required in conventional embodiments. Additionally, growth of the epitaxial layer 706 between each of the vertical sidewalls 704 provides a flatter top of the epitaxial layer 706 that is easier to polish.

Following the method 600, the resulting recessed structure 700 is shown in FIG. 7B. The resulting recessed structure 700 includes an epitaxial layer 706 formed on the horizontal portion of the substrate 702 between each of the vertical sidewalls 704. However, the resulting recessed structure 700 has no epitaxial layer 706 formed on the vertical sidewalls 704. Accordingly, the method 600 advantageously results in selective epitaxial growth on recessed structures, such as the recessed structure 700. In these embodiments, the resulting epitaxial layer can be between about 10 nm and about 30 nm, such as about 20 nm.

While the foregoing is directed to implementations of the present invention, other and further implementations of the invention may be devised without departing from the basic scope thereof, and the scope thereof is determined by the claims that follow.

We claim:

1. A method of processing a substrate in a process chamber, comprising:
   exposing the substrate having one or more fins into a process volume of the process chamber;
   introducing precursor gases into the process chamber;
   growing an epitaxial layer on top surfaces of each of the one or more fins; and
   etching the epitaxial layer on sidewall surfaces of each of the one or more fins, wherein:
      growing the epitaxial layer and etching the epitaxial layer occur simultaneously,
      growth of the epitaxial layer on the top surfaces occurs at a greater rate than etch, and
      etch of the epitaxial layer on the sidewall surfaces occurs at a greater rate than growth.

2. The method of claim 1, wherein the precursor gases include silane ($SiH_4$) and germanium tetrachloride ($GeCl_4$).

3. The method of claim 2, further comprising a dopant gas within the process chamber.

4. The method of claim 1, wherein the process chamber is heated to temperatures between about 350 degrees Celsius and about 700 degrees Celsius.

5. The method of claim 1, wherein the process chamber is controlled at pressures between about 5 Torr and about 10 Torr.

6. The method of claim 1, wherein the epitaxial layer is grown at a growth rate between about 30 Å/min and about 300 Å/min.

7. The method of claim 1, wherein the substrate having the one or more fins comprises a Fin Field Effect Transistor (FinFET) device.

8. A method of processing a substrate in a process chamber, comprising:
   exposing the substrate having a recessed structure with vertical sidewalls into a process volume of the process chamber;
   introducing precursor gases into the process chamber;
   growing an epitaxial layer on a horizontal portion of the substrate between each of the vertical sidewalls; and
   etching the epitaxial layer on surfaces of each of the vertical sidewalls, wherein:
      growing the epitaxial layer and etching the epitaxial layer occur simultaneously,
      growth of the epitaxial layer on the top surfaces occurs at a greater rate than etch, and
      etch of the epitaxial layer on the sidewall surfaces occurs at a greater rate than growth.

9. The method of claim 8, wherein the precursor gases include silane ($SiH_4$) and germanium tetrachloride ($GeCl_4$).

10. The method of claim 9, further comprising a dopant gas within the process chamber.

11. The method of claim 8, wherein the process chamber is heated to temperatures between about 350 degrees Celsius and about 700 degrees Celsius.

12. The method of claim 8, wherein the process chamber is controlled at pressures between about 5 Torr and about 10 Torr.

13. The method of claim 8, wherein the epitaxial layer is grown at a growth rate between about 30 Å/min and about 300 Å/min.

14. The method of claim 8, wherein the vertical sidewalls comprise two vertical sidewalls.

15. A method of processing a substrate in a process chamber, comprising:
   exposing the substrate having one or more fins into a process volume of the process chamber, wherein each of the one or more fins has a {100} plane and a {110} plane;
   introducing precursor gases into the process chamber;
   growing an epitaxial layer on the {100} plane of each of the one or more fins; and
   etching an epitaxial layer on the {110} plane of each of the one or more fins, wherein:
      growing the epitaxial layer and etching the epitaxial layer on the {110} plane of each of the one or more fins occur simultaneously,
      growth of the epitaxial layer in the {100} plane of each of the one or more fins occurs at a greater rate than etch, and
      etch of the epitaxial layer on the {110} plane of each of the one or more fins occurs at a greater rate than growth.

16. The method of claim 15, wherein the precursor gases include silane ($SiH_4$) and germanium tetrachloride ($GeCl_4$).

17. The method of claim 16, further comprising a dopant gas within the process chamber.

18. The method of claim 15, wherein the process chamber is heated to temperatures between about 350 degrees Celsius and about 700 degrees Celsius.

19. The method of claim 15, wherein the process chamber is controlled at pressures between about 5 Torr and about 10 Torr.

20. The method of claim 15, wherein the epitaxial layer is grown at a growth rate between about 30 Å/min and about 300 Å/min.

\* \* \* \* \*